(12) United States Patent
Komiya (10) Patent No.: US 6,509,692 B2
(45) Date of Patent: Jan. 21, 2003

(54) SELF-EMISSIVE DISPLAY DEVICE OF ACTIVE MATRIX TYPE AND ORGANIC EL DISPLAY DEVICE OF ACTIVE MATRIX TYPE

(75) Inventor: Naoaki Komiya, Ogaki (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/918,960

(22) Filed: Jul. 31, 2001

(65) Prior Publication Data

US 2002/0021096 A1 Feb. 21, 2002

(30) Foreign Application Priority Data

Jul. 31, 2000 (JP) ........................................ 2000-231854

(51) Int. Cl.[7] ................................................ G09G 3/10
(52) U.S. Cl. ................................ 315/169.3; 315/169.1; 345/76; 345/92
(58) Field of Search ............................ 345/55, 76, 77, 345/92, 98; 315/169.1, 169.2, 169.3, 169.4, 158, 159

(56) References Cited

U.S. PATENT DOCUMENTS

| 5,598,180 | A | | 1/1997 | Suzuki et al. | |
|---|---|---|---|---|---|
| 5,684,365 | A | * | 11/1997 | Tang et al. | ............... 315/169.3 |
| 6,023,259 | A | | 2/2000 | Howard et al. | |
| 6,366,025 | B1 | * | 4/2002 | Yamada | ................... 315/169.3 |
| 6,366,026 | B1 | * | 4/2002 | Saito et al. | ............... 315/169.3 |
| 6,396,217 | B1 | * | 5/2002 | Weindorf | ................... 315/169.1 |
| 6,246,179 | B1 | * | 6/2002 | Yamada | ................... 315/169.3 |
| 6,421,033 | B1 | * | 7/2002 | Williams et al. | ............... 345/55 |
| 6,278,242 | B1 | * | 8/2002 | Cok et al. | ................. 315/169.1 |

FOREIGN PATENT DOCUMENTS

| EP | 0 917 172 | 5/1999 |
|---|---|---|
| EP | 1 096 465 | 5/2001 |
| WO | 98/36406 | 8/1998 |
| WO | 99/38148 | 7/1999 |

OTHER PUBLICATIONS

Notice of grounds for rejection, patent application No. 2000–231854.

* cited by examiner

*Primary Examiner*—Tho Phan
(74) *Attorney, Agent, or Firm*—Cantor Colburn LLP (57) ABSTRACT

In a self-emissive display device including a selection TFT (4) having a gate connected to a gate line (1) and a drain connected to a data line (2), and a driving TFT (6) having a gate connected to a source of the selection TFT (4), a positive power source PV, the driving TFT (6), an organic EL emissive element (7), and a negative power source CV are connected in series. Because a shift voltage for shifting a correlation curve between the gate signal and the luminance of emitted light is applied to the negative power source CV, there is no need to raise the voltage level of the data signal by the voltage producing no effect on displayed tone. Accordingly, power consumption is reduced, and the data signal can be supplied by a circuit manufactured through a common CMOS process, leading to a reduction in manufacturing costs.

15 Claims, 10 Drawing Sheets

PRIOR ART

SELF-EMISSIVE DISPLAY DEVICE OF ACTIVE MATRIX TYPE AND ORGANIC EL DISPLAY DEVICE OF ACTIVE MATRIX TYPE

BACKGROUND OF THE INVENTION

1. Field of the Invention

The present invention relates to a self-emissive display device of an active matrix type having a self-emissive element which is driven by a selection driving circuit formed of a thin film transistor (TFT) or the like disposed individually for each pixel, and more particularly to an organic electroluminescence (EL) display device of the active matrix type.

2. Description of the Related Art

Because self-emissive display devices are smaller and consume less electric power than CRTs, and exhibit no dependency on the viewing angle unlike LCDs, EL display devices employing EL elements are attracting attentions in recent years as potential replacements for CRTs and LCDs. Further, EL display devices provided with TFTs as switching elements for driving such EL elements, for example, are now being developed.

Figure 1:
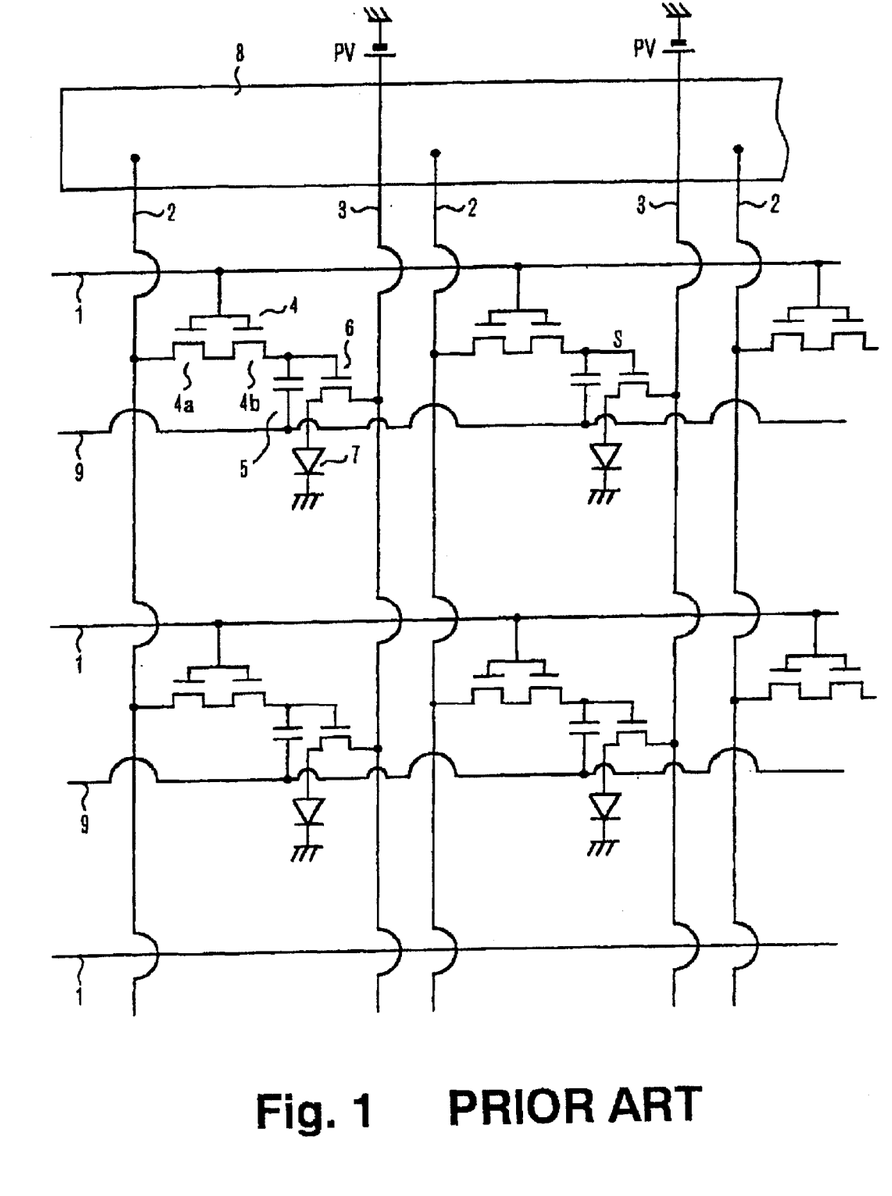
FIG. 1 is a circuit diagram illustrating a conventional organic EL display device.

FIG. 1 is an equivalent circuit diagram of an organic EL display device. In the device, a plurality of gate lines 1 extending in a row direction are disposed, and a plurality of data lines 2 and a plurality of driving lines 3 are disposed in a column direction crossing the gate lines. The driving line 3 is connected to a power source PV, which supplies a positive constant voltage of, for example, 10 V using a ground voltage as a reference voltage. A selection TFT 4 is connected to each intersection between the gate line 1 and the data line 2. The selection TFT 4 is of a double gate configuration in which two TFTs 4a and 4b are connected in series. The TFTs 4a and 4b of the selection TFT 4 each have a gate connected to the gate line 1, and a drain of the TFT 4a is connected to the data line 2. The selection TFT 4b has a source connected to one electrode of a storage capacitor 5 and a gate of a driving TFT 6, which has a drain connected to the driving line 3 and a source connected to an anode of an organic EL emissive element 7. The cathode of the organic EL emissive element 7 is connected to ground. A capacitor line 9 extending in the column direction is connected to the other electrode of the storage capacitor 5.

The gate lines 1 are connected to an unillustrated gate line driver, and sequentially receive a gate signal applied by the gate line driver. The gate signal is a binary signal which assumes either an ON or OFF state. The signal has a positive predetermined voltage in the ON state, and 0V in the OFF state. The gate line driver turns on the gate signal on the predetermined gate line selected among the plurality of gate lines 1 connected thereto. When the gate signal is turned on, TFTs of all the selection transistors 4 connected to that gate line 1 are turned on, and the data line 2 and the gate of a driving transistor 6 are connected through the selection transistor 4. To the data line 2, a data signal determined in accordance with a displayed image is applied from a data line driver 8, and is therefore applied to the gate of the driving transistor 6 and charged in the storage capacitor 5. The driving transistor 6 connects the driving line 3 and the organic EL emissive element 7 at an electrical conductivity corresponding to the value of the data signal. As a result, a current corresponding to the data signal is supplied from the driving line 3 to the organic EL emissive element 7 through the driving transistor 6, whereby the organic EL emissive element 7 emits light at a luminance corresponding to the data signal. The storage capacitor 5 forms a static capacitor with another electrode, such as a dedicated capacitor line 9 or the driving line 3, and is capable of storing the data signal for a predetermined period of time. Even after a particular gate line 1 is deselected to turn off the selection transistor 4 when the gate line driver selects another gate line 1, the data signal is stored by the storage capacitor 5 for one vertical scanning period, during which the driving transistor 6 maintains the above electrical conductivity. The organic EL emissive element can thereby continue to emit light at the same luminance.

For the active matrix organic EL display device operating in the above-described principles, it should be noted that the term "selection driving circuit" in this specification refers generally to a circuit having the selection transistor 4 and the driving transistor 6 described above and applying a signal simultaneously selecting one or more display elements, such as the gate signal, and the data signal determined by the displayed image to thereby supply a current corresponding to the data signal to a predetermined display element.

Figure 2:
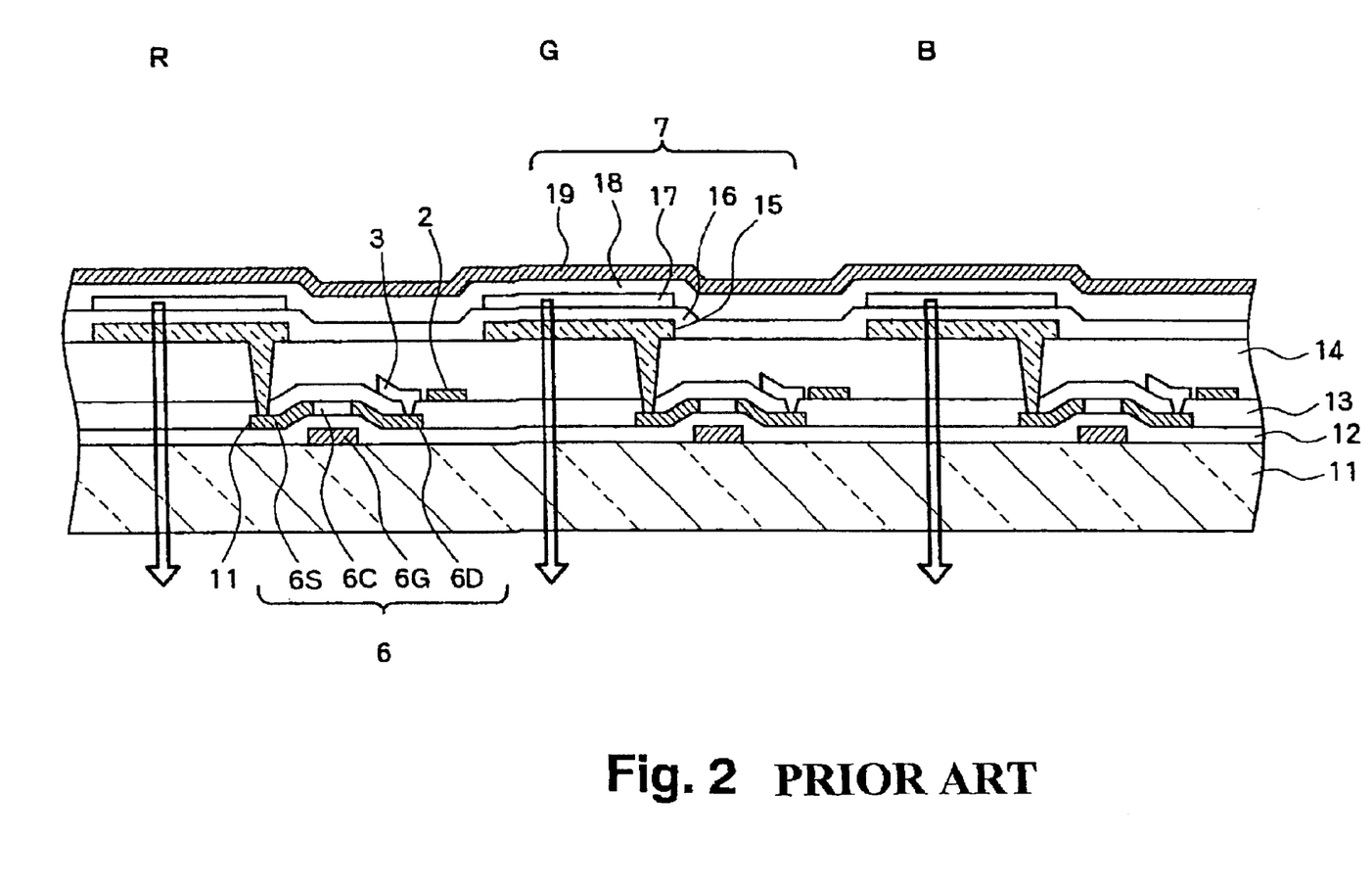
FIG. 2 is a cross sectional view of an organic EL display device.

FIG. 2 is a cross sectional view of an organic EL display device of the active matrix type. A plurality of driving TFTs 6 are disposed on a glass substrate 11. In the driving TFT 6, a gate electrode 6G is provided facing a source 6S, a channel 6C, and a drain 6D with an interlayer insulating film 12 interposed between them. In the illustrated example, the driving TFT 6 is of a bottom gate type with the gate electrode 6G disposed below the channel 6C. An interlayer insulating film 13 is formed on the driving TFT 6, and the data line 2 and the driving line 3 are disposed on top of the film 13. The driving line 3 is connected to the drain 6D of the driving TFT 6 through a contact hole. On such elements a planarization insulating film 14 is formed, on which the organic EL emissive element 7 is disposed for each pixel. The organic EL emissive element 7 is composed of an anode 15 formed of a transparent electrode of, for example, ITO (indium tin oxide), a hole transportation layer 16, an emissive layer 17, an electron transportation layer 18, and a cathode 19 of a metal, such as aluminum, stacked in the above order. Holes injected from the anode 15 to the hole transportation layer 16 and electrons injected from the cathode 19 to the electron transportation layer 18 are recombined in the emissive layer 17 to cause emission of light, which is transmitted through the transparent electrode 15 and the glass substrate 11 to outside, as indicated by the arrow in the figure. The anode 15 and the emissive layer 17 are individually formed for each pixel, while the hole transportation layer 16, the electron transportation layer 18, and the cathode 19 are shared by respective pixels.

Figure 3:
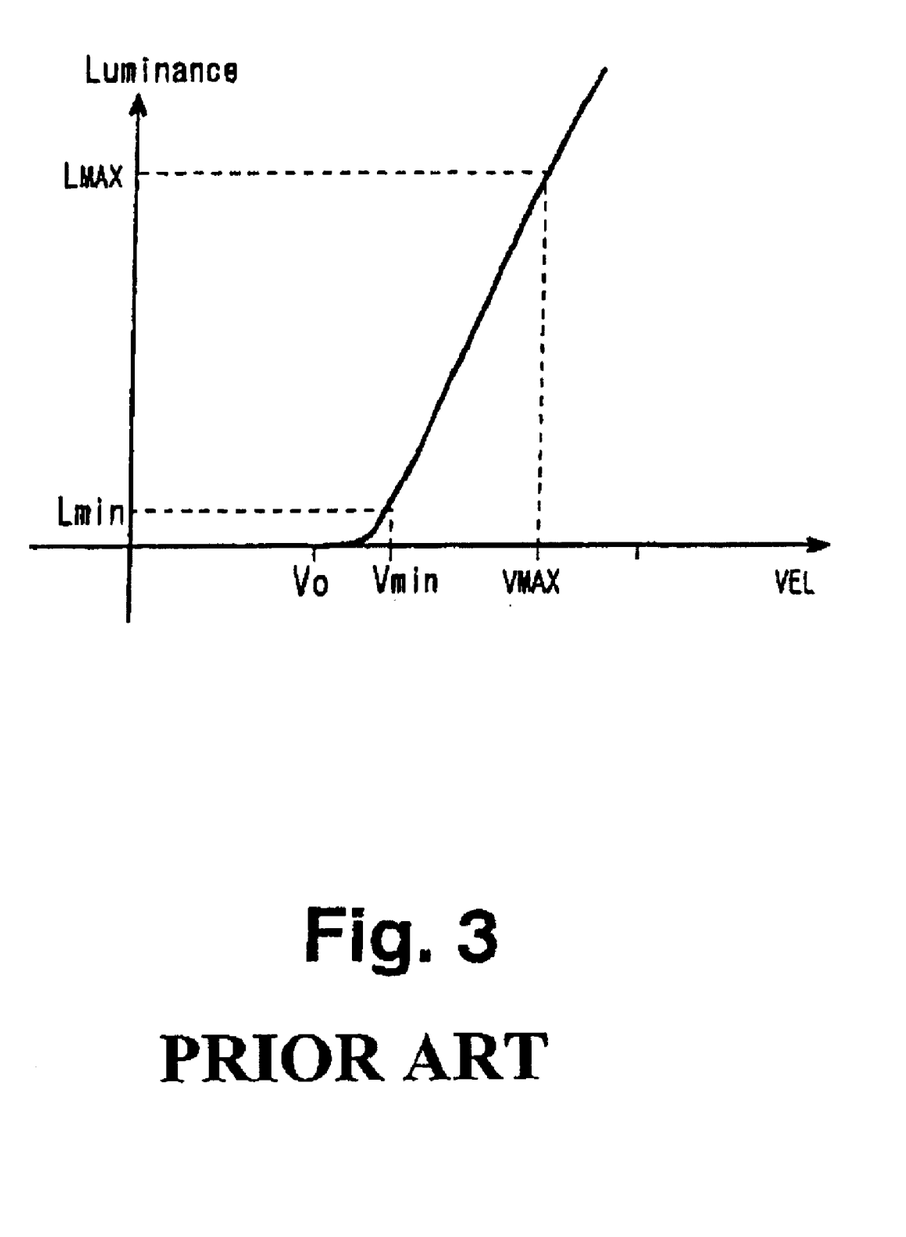
FIG. 3 is a graph of the luminance of emitted light with respect to a voltage in an organic EL emissive element.

FIG. 3 shows a correlation curve between a voltage $V_{EL}$ applied to the organic EL emissive element 7 and the luminance of light emitted at the corresponding moment. Light is not emitted regardless of the voltage value when the voltage $V_{EL}$ is at a predetermined value $V_0$ or smaller. After light emission begins when the voltage $V_{EL}$ exceeds the predetermined value $V_0$, the luminance is increased with an increase in the voltage $V_{EL}$. When an organic EL element is used as an emissive element in a display device, images are displayed by controlling the voltage $V_{EL}$ applied to the EL emissive element to fall within a range between a minimum voltage $V_{min}$ for a current observed when the EL emissive element emits dim light at a predetermined luminance $L_{min}$ and a maximum voltage $V_{MAX}$ for a current corresponding to a maximum luminance $L_{MAX}$ defined as the luminance resulting in a predetermined contrast ratio to the luminance $L_{min}$ of, for example, 100:1. Although it is possible to cause stronger light emission and achieve a higher contrast by setting the voltage $V_{EL}$ to an even higher value, the life of an organic EL element is shortened by strong light emission, which requires a larger amount of current. Therefore, in view of both the life and current consumption, the maximum luminance and contrast are set at a level appropriate to the circumstances under which the display device is employed.

Figure 4:
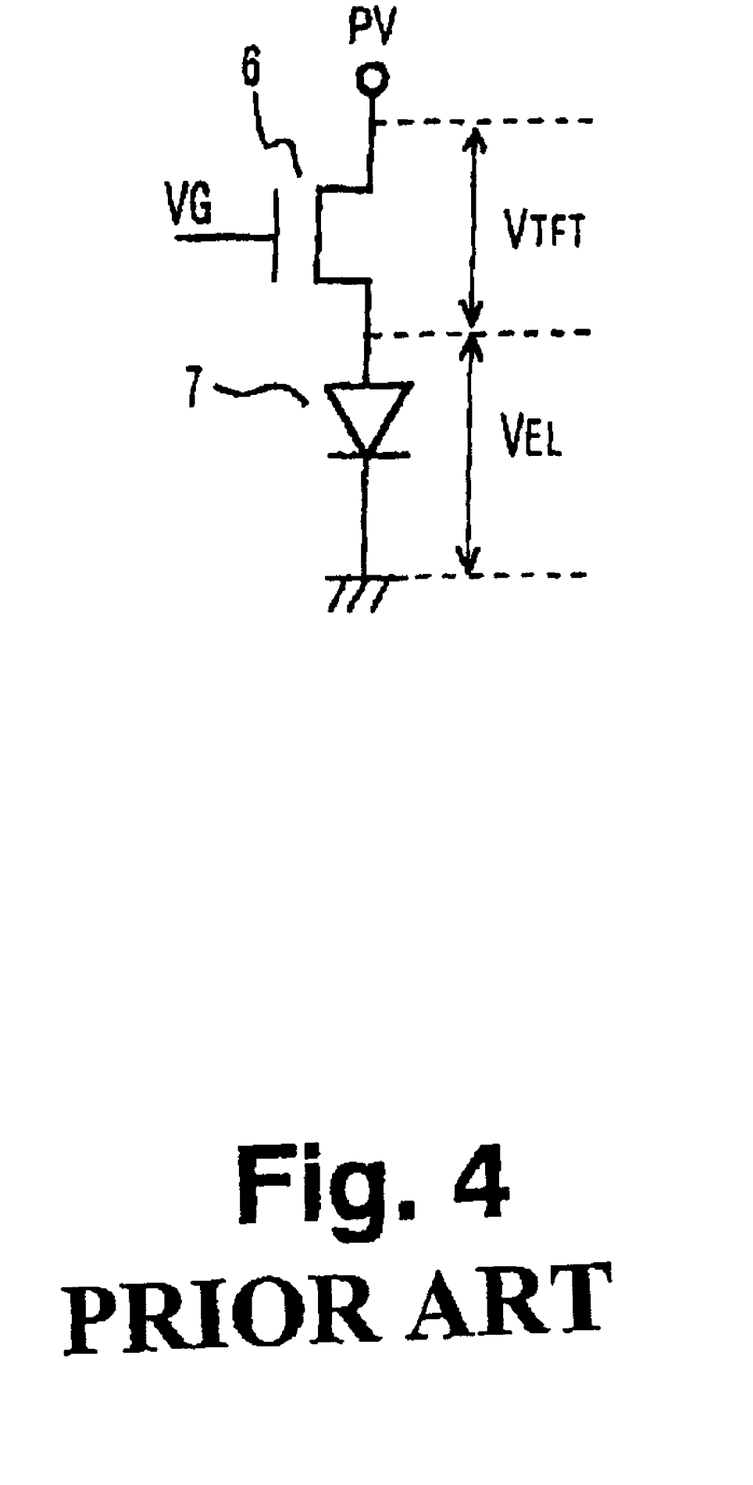
FIG. 4 is a circuit diagram illustrating part of the conventional organic EL display device.
Figure 5A:
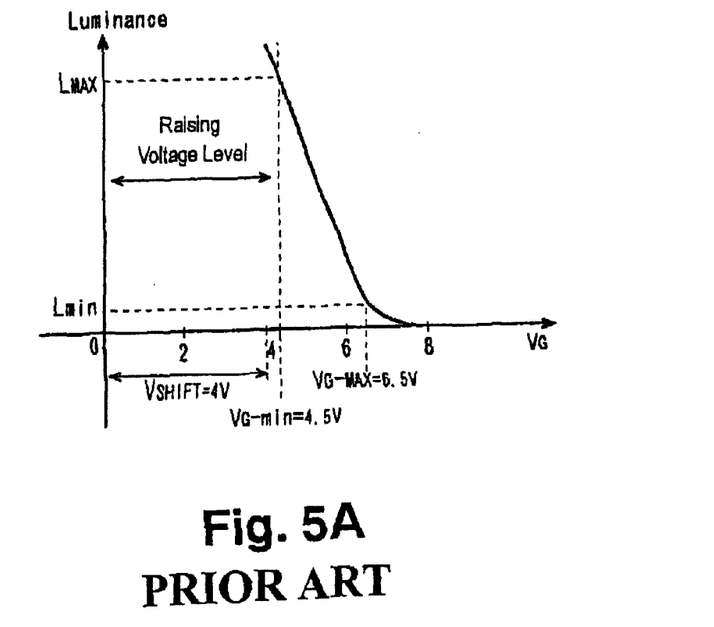
FIGS. 5A and 5B are graphs of the luminance of light emitted from an organic EL element with respect to a gate voltage of a driving TFT in the conventional organic EL display device.
Figure 5B:
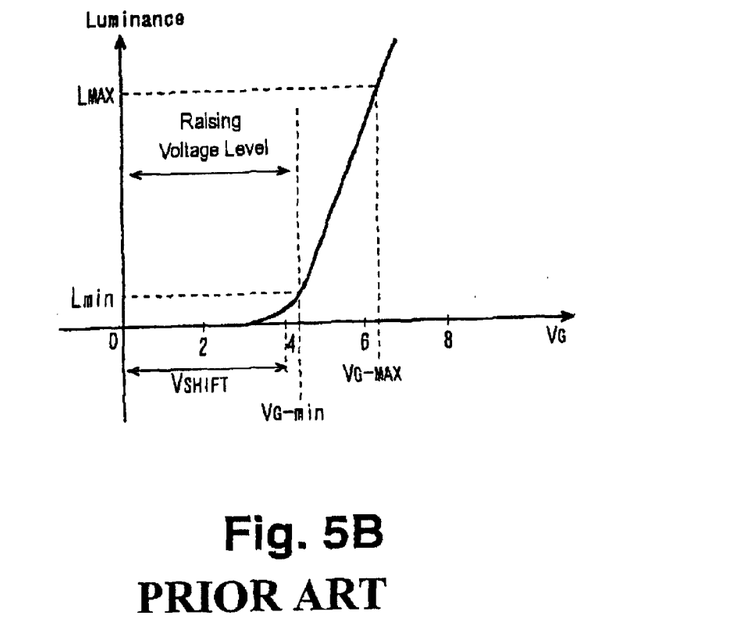

FIG. 4 is a circuit diagram illustrating only the power source PV, the driving TFT 6, and the EL emissive element 7 for one pixel, extracted from the circuit diagram of FIG. 1. As can be seen from the figure, the driving TFT 6 and the organic EL emissive element 7 are connected in series between the power source PV and ground. A current $I_{EL}$ flowing through the organic EL emissive element 7 is supplied from the power source PV to the organic EL emissive element 7 via the driving transistor 6, and can be controlled by changing a gate voltage VG of the driving transistor 6. As described above, the data signal is supplied to the gate electrode, and the gate voltage VG assumes a value corresponding to the data signal. FIGS. 5A and 5B show a correlation between the gate voltage VG of the driving transistor 6 and the luminance of light emitted from the EL emissive element 7 when the driving transistor 6 is a p-type TFT and an n-type TFT, respectively. When the driving transistor 6 is a p-type TFT, the maximum luminance $L_{MAX}$ is achieved with the gate voltage VG of 4.5 V. The luminance decreases with an increase in the gate voltage VG, and drops to the minimum luminance $L_{min}$ with the gate voltage VG of 6.5 V. Further, light emission cannot be observed when the gate voltage VG reaches approximately 8 V. On the other hand, when the driving transistor 6 is an n-type TFT, light emission begins with application of a gate voltage VG of about 3 V, and the luminance increases with an increase in the gate voltage VG. The minimum luminance $L_{min}$ and the maximum luminance $L_{MAX}$ are obtained when the gate voltage VG is 4.5V and 6.5 V, respectively.

Figure 6:
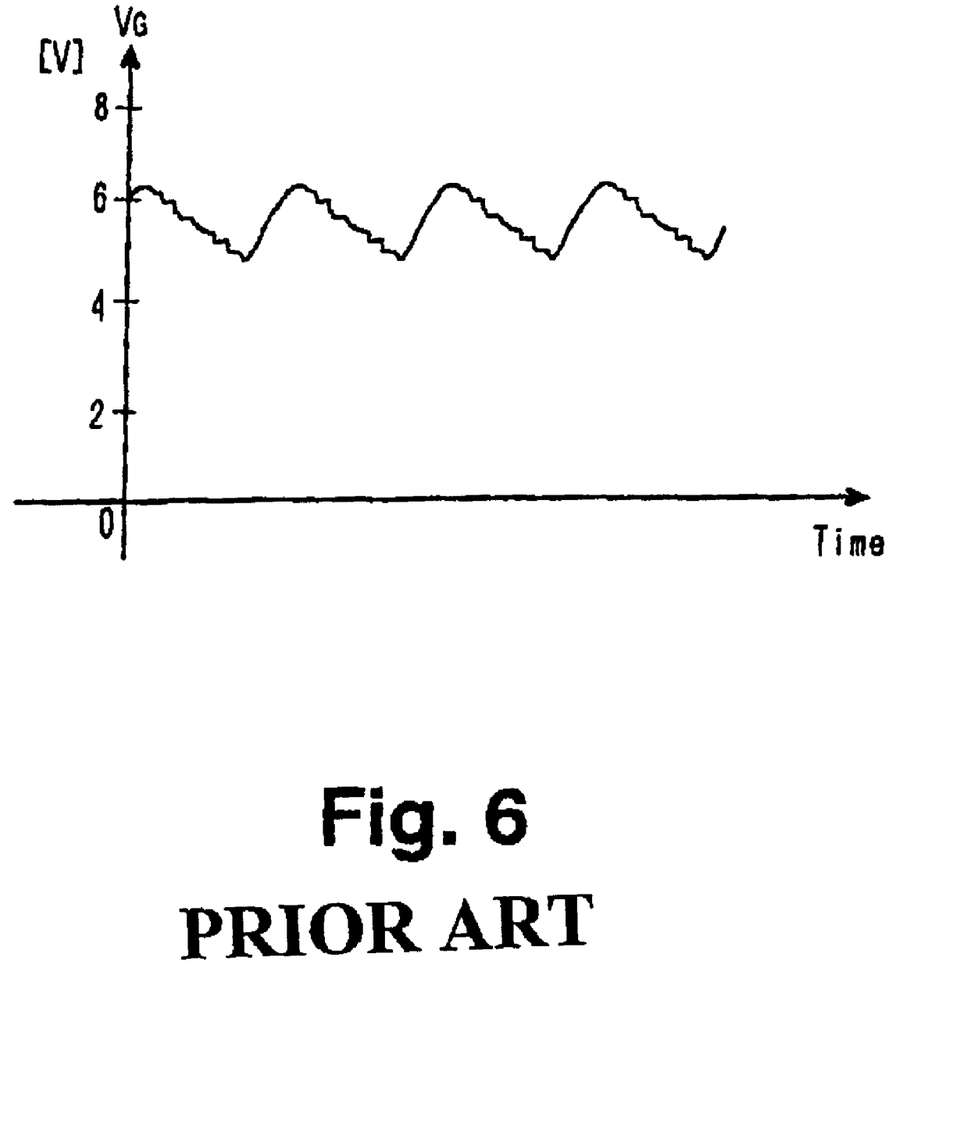
FIG. 6 illustrates an example of a data signal in the conventional organic EL display device.

From the foregoing, it can be concluded that the gate voltage of the driving transistor 6, i.e. the data signal, should be output after being adjusted to a value ranging from $VG_{min}$ of 4.5 to $VG_{MAX}$ of 6.5 V and corresponding to the displayed tone in order to control the luminance of light emitted from the organic EL emissive element 7. FIG. 6 shows an example of chronological change of the data signal to be applied to the gate of the driving transistor 6.

However, applying such a data signal requires a power source capable of supplying a large amount of current to deal with the maximum data signal. The data signal is produced by an unillustrated external data signal processing circuit for processing an externally applied video signal into a signal optimum for use as the gate voltage applied to the driving transistor 6. When the voltage of the data signal to be supplied from the processing circuit is high, the driving voltage of such a data signal processing circuit must also be raised, leading to an increase in power consumption.

Especially when the voltage $VG_{MAX}$ exceeds 5 V, the data signal processing circuit must be designed to have a high withstanding voltage, making it difficult to manufacture the circuit through a common CMOS process. Accordingly, the above-described self-emissive display device of the active matrix type consumes a large amount of electric power, and is expensive to manufacture.

SUMMARY OF THE INVENTION

An object of the present invention is to provide an active matrix type self-emissive display device which consumes less electric power during operation, and which can be inexpensively manufactured.

To achieve the above object, the present invention comprises the following characteristics.

A self-emissive display device of an active matrix type according to the present invention comprises a plurality of selection lines extending in a row direction, a plurality of data lines extending in a column direction, a selection driving circuit disposed corresponding to and a vicinity of each intersection between said selection line and said data line, and an emissive element connected to each selection driving circuit, wherein said emissive element emits light at a luminance in accordance with a data signal in response to a current supplied to said emissive element in accordance with the data signal supplied to said data line when said selection driving circuit is turned on in response to a selection signal supplied to said selection line, and said emissive element is connected between a first power source for applying a voltage of a first polarity with respect to a reference voltage and a second power source for applying a voltage of a polarity opposite to said first polarity.

According to one aspect of the present invention, a display device of an active matrix type is provided wherein each of a plurality of pixels is provided with a selection transistor, an element driving transistor, and an emissive element, said emissive element emits light in response to a current supplied to said emissive element through said element driving transistor in accordance with a data signal supplied to said element driving transistor through said selection transistor when the selection transistor is turned on in response to a selection signal supplied thereto, and said element driving transistor and said emissive element are connected in series between a first power source for applying a voltage of a first polarity with respect to a reference voltage and a second power source for applying a voltage of a polarity opposite to said first polarity.

According to other aspect of the present invention, a self-emissive display device of an active matrix type comprises a plurality of selection lines extending in a row direction and sequentially receiving a selection signal, a plurality of data lines extending in a column direction and receiving a data signal in accordance with displayed content, and a selection transistor, an element driving transistor, and an emissive element, provided in the vicinity of each intersection between said selection line and said data line, wherein said selection transistor has a gate connected to a corresponding one of said plurality of selection lines, said element driving transistor has a gate connected to a corresponding one of said plurality of data lines through said selection transistor, said emissive element has an anode connected to said element driving transistor and receiving a current from a first power source through said element driving transistor, and said emissive element has a cathode connected to a second power source for shifting a data voltage.

According to other aspect of the present invention, said first power source is a positive power source, and said second power source is a negative power source.

According to other aspect of the present invention, said selection signal has a first potential of a predetermined polarity when selected, and a second potential of a polarity opposite to that of said first potential when unselected.

According to other aspect of the present invention, said selection signal has a first potential of a predetermined polarity when selected, and, when unselected, a second potential of a polarity opposite to that of said first potential to turn off said selection driving circuit or said selection transistor, said second potential being larger than the absolute value of a minimum required luminance voltage of said data signal or the absolute value of a maximum required luminance voltage thereof.

According to other aspect of the present invention, said emissive element is an organic electroluminescence element.

According to the present invention, a self-emissive element is connected between a first power source for supplying a voltage of a first polarity and a second power source for supplying a voltage of a polarity opposite to the first polarity, so that the data signal can be shifted by an amount corresponding to the second power source voltage to contribute to reduction in voltage, whereby power consumption of the display device can be reduced.

Further, the data signal processing circuit does not require a transistor with a high withstanding voltage, and therefore can be manufactured through a common CMOS process, thereby reducing the cost to manufacture the display device.

DESCRIPTION OF THE PREFERRED EMBODIMENT

Figure 7:
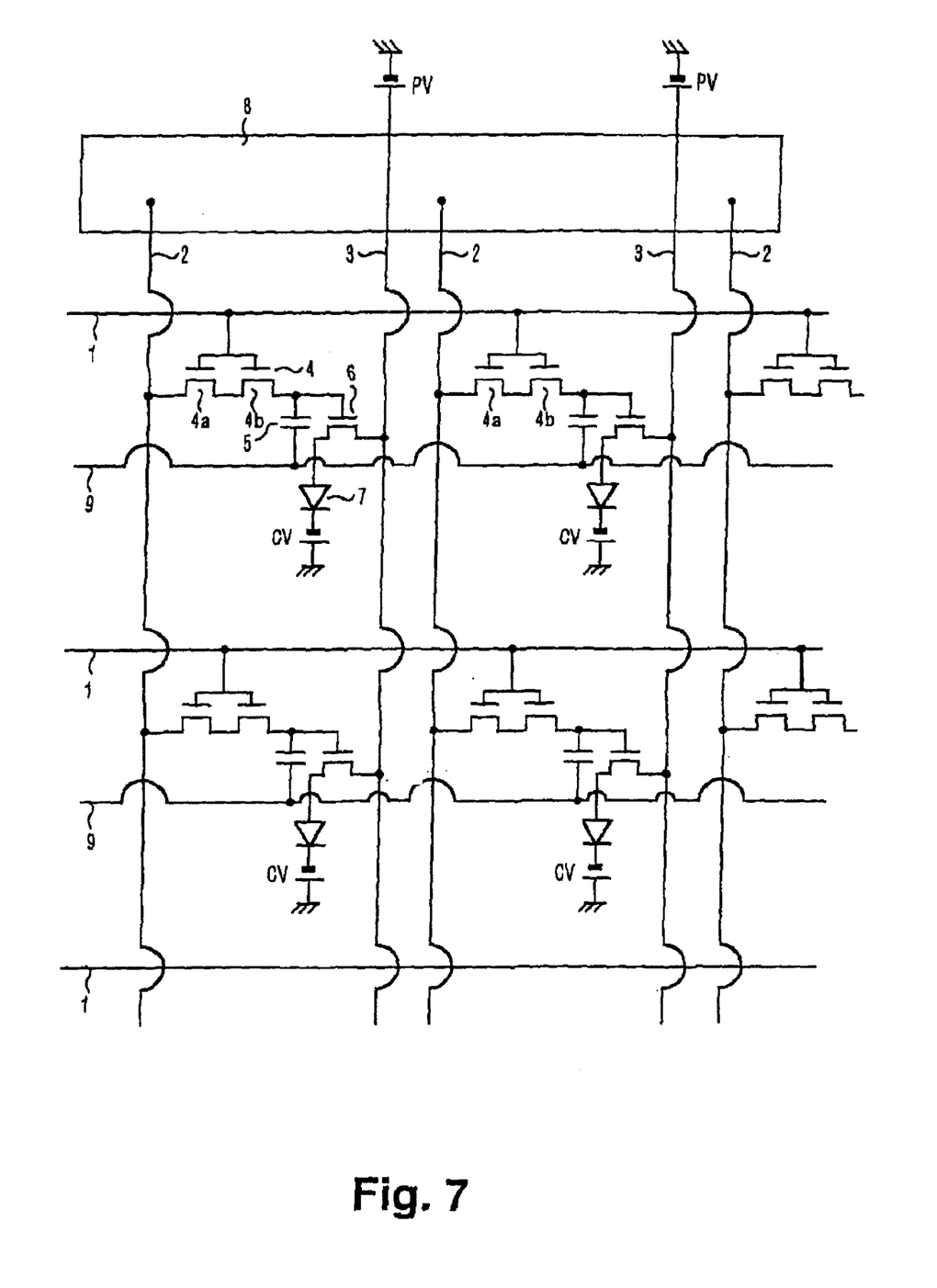
FIG. 7 is a circuit diagram illustrating an organic EL display device according to an embodiment of the present invention.

FIG. 7 is an equivalent circuit diagram of an EL display device according to a preferred embodiment of the present invention. A plurality of gate lines 1 are provided extending in a row direction, and a plurality of data lines 2 and a plurality of driving lines 3 are provided in a column direction crossing the gate lines 1. A selection TFT 4 is connected to each intersection between the gate line 1 and the data line 2. The selection TFT 4 is of a double gate configuration in which two TFTs 4a and 4b are connected in series. The TFTs 4a and 4b of the selection TFT 4 each have a gate connected to the gate line 1, and a drain of the TFT 4a is connected to the data line 2. The selection TFT 4b has a source connected to a storage capacitor 5 and a gate of a driving TFT 6, which has a drain connected to the driving line 3 and a source connected to an anode of an organic EL emissive element 7.

The above-described circuit configuration is similar to that of the EL display device illustrated in FIG. 4, and a cross sectional configuration of the device is also similar to that illustrated in FIG. 2.

Figure 8:
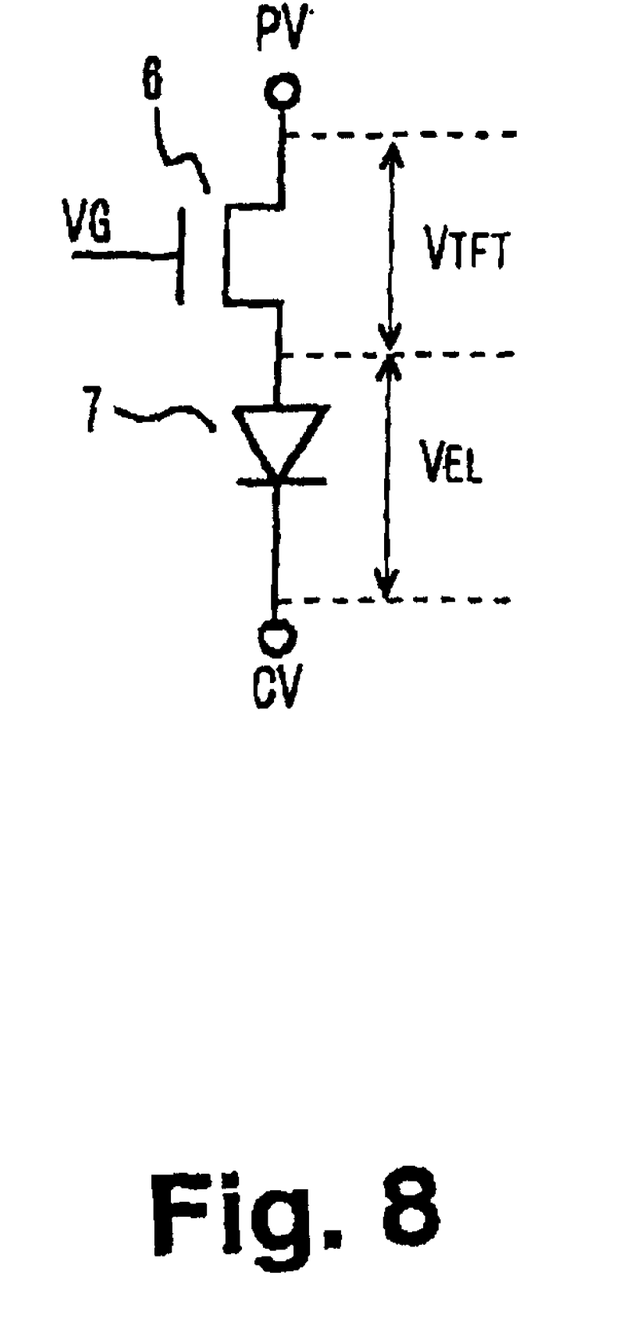
FIG. 8 is a circuit diagram illustrating part of the organic EL display device according to an embodiment of the present invention.

The configuration according to the present embodiment is characterized in that a cathode of the organic EL emissive element 7 is connected not to ground but to a power source CV for applying a negative shift voltage $V_{SHIFT}$. FIG. 8 is a circuit diagram illustrating a power source PV provided on the anode side, the driving TFT 6, the EL emissive element 7, and the power source CV on the cathode side for one pixel, extracted from the circuit diagram of FIG. 7. The driving TFT 6 and the organic EL emissive element 7 are connected in series between the power source PV and the power source CV for applying positive and negative voltages, respectively, using the ground voltage as a reference voltage.

While the conventional organic EL emissive element 7 must be driven by a voltage ranging from $V_{Gmin}$ to $V_{GMAX}$ to cause emission of light at an appropriate luminance as described above, a voltage smaller than $V_{Gmin}$ merely raises the voltage level and produces no effect on displayed tone. Therefore, according to the present embodiment, the polarity of such a level raising voltage shown in FIGS. 5A and 5B is inverted to be applied to the negative power source CV as the shift voltage $V_{SHIFT}$. In the present embodiment, the voltage of the power source Cv, i.e. the shift voltage $V_{SHIFT}$, is −4 V. As a result, the potentials at the anode and cathode of the organic EL emissive element 7 are reduced, and therefore the gate of the driving transistor 6 connected to the anode of the element 7 virtually receives a voltage ranging from 4.5 V to 6.5 V similarly to the cases illustrated in FIGS. 5A and 5B.

The luminance of light emitted from the organic EL emissive element 7 is determined by the potential difference between the anode and the cathode thereof. In contrast to the conventional art in which such a potential difference is supplied between the positive power source PV and ground, both the positive power source PV and the negative power source CV are utilized so that the correlation between the luminance of light emitted from the organic EL emissive element 7 and the gate voltage at the driving transistor 6 can be shifted from that shown in FIG. 5A or FIG. 5B to that in FIG. 9A or FIG. 9B. This is achieved by a revolutionary approach of capitalizing on the fact that the level raising voltage, as shown in Figs. 5A and 5B, produces no effect on displayed tone, and applying an inverted version of that voltage from the negative power source to the cathode side of the organic El element.

Figure 9A:
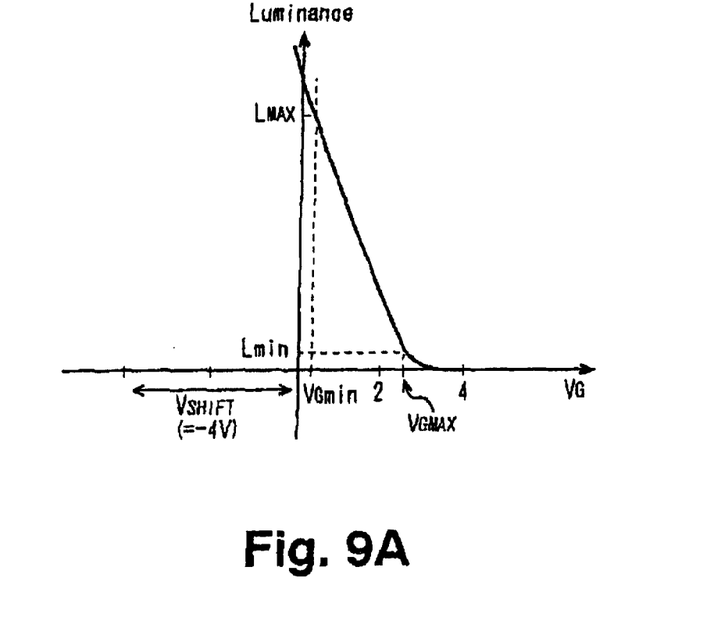
FIGS. 9A and 9B are graphs of the luminance of light emitted from an organic EL element with respect to a gate voltage of a driving TFT according to an embodiment of the present invention.
Figure 9B:
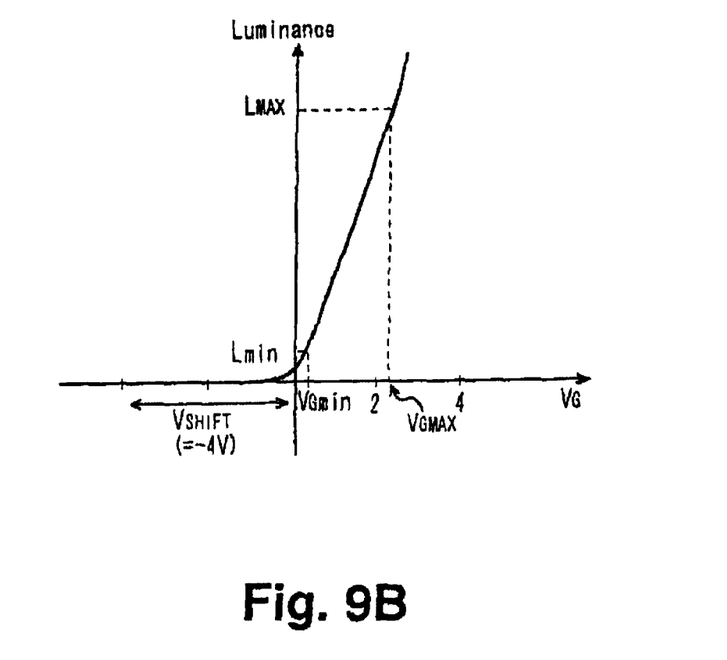
Figure 10:
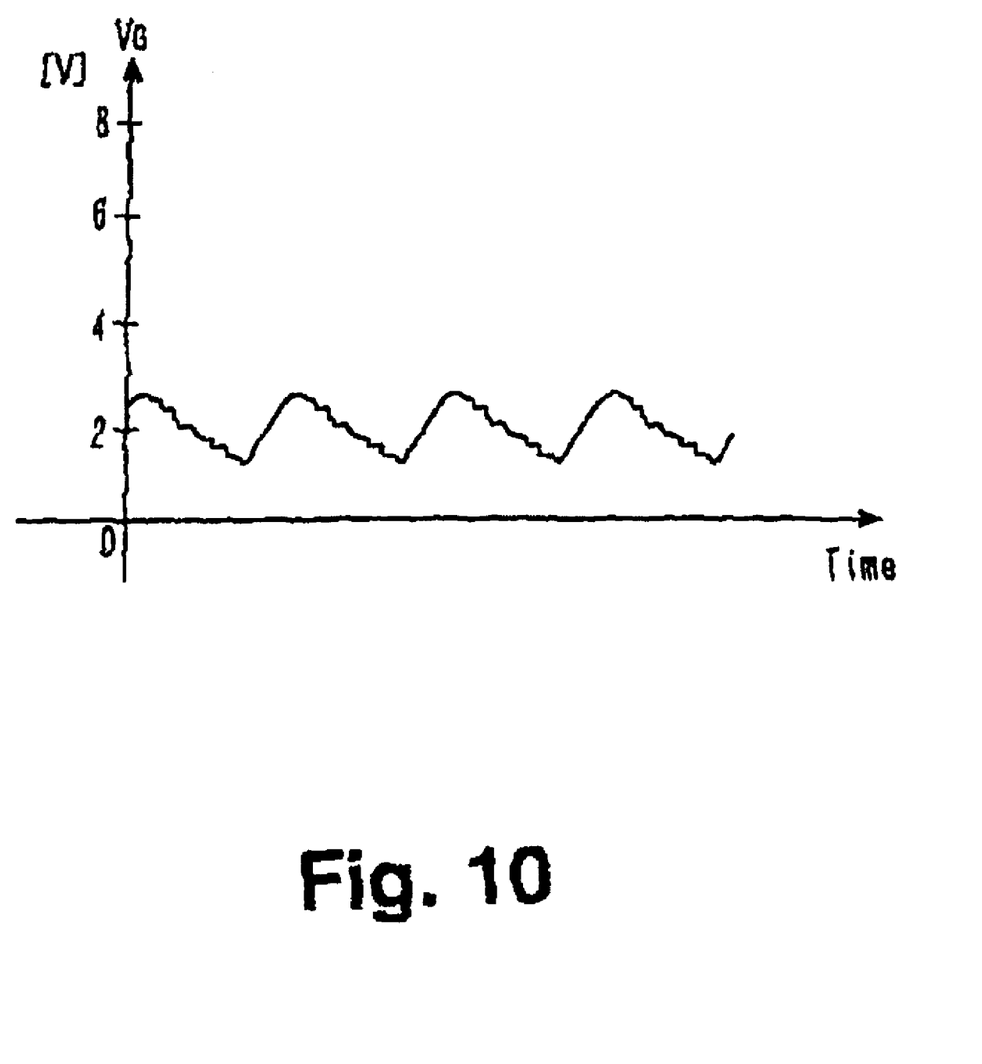
FIG. 10 illustrates an example of a data signal according to an embodiment of the present invention.

FIGS. 9A and 9B show the correlation between the gate voltage VG of the driving transistor 6 and the luminance of light emitted from the organic EL emissive element 7 according to the present embodiment. FIG. 9A shows the case when the driving transistor 6 is a p-type TFT, while FIG. 9B shows the case when the transistor 6 is an n-type TFT. When the driving transistor 6 is a p-type TFT, the maximum luminance $L_{MAX}$ is reached when the gate voltage VG is 0.5 V. The luminance decreases with an increase in the gate voltage VG, and drops to the minimum luminance $L_{min}$ when the voltage VG is 2.5 V. The element does not emit light when the voltage VG reachs around 3 V. On the other hand, when the driving transistor 6 is an n-type TFT, the luminance hits the minimum luminance $L_{min}$ and the maximum luminance $L_{MAX}$ when the voltage VG is 0.5V and 2.5V, respectively. Accordingly, the data voltage of the present embodiment should be set in a range between $V_{Gmin}$ of 0.5 V and $V_{GMAX}$ of 2.5 V, and therefore the element can be driven by a lower data voltage than the conventional element. Thus, the device according to the present embodiment can be driven with less electric power than the conventional device. Further, because the shift voltage $V_{SHIFT}$ of −4 V and the maximum data voltage $V_{GMAX}$ of 2.5 V both have an absolute value smaller than 5 V, the data signal processing circuit employed in this embodiment can be formed through the CMOS process, contributing to reduction in manufacturing costs.

The shift voltage $V_{SHIFT}$ corresponding to the level raising voltage can be set at a desired value. The data signal can be shifted in accordance with the shift voltage $V_{SHIFT}$. The voltage $V_{SHIFT}$ may be set at −4 V as in the present embodiment, or at a smaller value. When the voltage $V_{SHIFT}$ assumes a larger value, i.e. the voltage lower than −4 V, the data signal can be relatively shifted by the corresponding amount, contributing to reduction in power consumption. The voltage $V_{SHIFT}$ may assume any value as long as the shifted data signal has a maximum value of 5 V or smaller. Alternatively, the voltage $V_{SHIFT}$ may be set at −4.5 V for the panel used in the present embodiment so that the shifted data signal has the minimum value $V_{Gmin}$ of 0 V.

The gate voltage of the selection transistor 4 is usually controlled in a binary manner (ON or OFF), wherein the ON voltage is set at 0 V and the OFF voltage at a predetermined positive voltage. However, when the shift voltage is set such that the minimum voltage $v_{Gmin}$ is 0 V, a problem arises when the data signal is dropped to $V_{Gmin}$. More specifically, with the data signal of 0 V, when a selection period of the gate line 1 is terminated to turn off the gate signal of the selection transistor 4, i.e. the gate signal has a voltage of 0 V, the active layer and the gate electrode in the selection transistor 4 both have a voltage of 0 V, generating no potential difference. Generally, when there is no potential difference between the active layer and the gate electrode in a transistor, a leakage current is generated at the channel. Such a problem can be addressed by controlling the gate signal of the selection transistor 4 to change within a range between a negative voltage in accordance with the voltage $V_{SHIFT}$ and a predetermined positive voltage. Consequently, even when the data line 2 has a potential of 0 V, or when the data voltage $V_{Gmin}$ assumed before the selection transistor 4 turns off is 0 V, the gate voltage is a sufficiently low negative voltage in accordance with the voltage $V_{SHIFT}$ when the selection transistor 4 is unselected, thereby preventing generation of a leakage current in the selection transistor 4.

According to the present embodiment, a cathode 19 is shared by a plurality of pixels, as shown in FIG. 2. Consequently, the present embodiment can easily be implemented by connecting a negative power source to any part of the cathode 19, and therefore connection of the negative power source CV does not require any special changes in masks or the like, leading to no significant increase in cost.

While an exemplary circuit including the selection TFT 4 and the driving TFT 6 illustrated in FIG. 7 is described as the selection driving circuit in the present embodiment, a circuit of any structure may be employed, such as a circuit including a selection TFT 4 of a common configuration rather than the double gate configuration, a circuit including additional TFTs for improving characteristics, or the like. As long as the circuit can supply a predetermined current to each self-emissive element disposed for each pixel, the present invention can similarly be implemented by disposing the self-emissive element between a power source of one polarity and a power source of the opposite polarity.

What is claimed is:

1. A self-emissive display device of an active matrix type, comprising:

a plurality of selection lines extending in a row direction;
a plurality of data lines extending in a column direction;
a selection driving circuit disposed corresponding to and a vicinity of each intersection between said selection line and said data line; and
an emissive element connected to each selection driving circuit; wherein
said emissive element emits light at a luminance in accordance with a data signal in response to a current supplied to said emissive element in accordance with the data signal supplied to said data line when said selection driving circuit is turned on in response to a selection signal supplied to said selection line, and
said emissive element is connected between a first power source for applying a voltage of a first polarity with respect to a reference voltage and a second power source for applying a voltage of a polarity opposite to said first polarity.

2. The self-emissive display device of an active matrix type according to claim 1, wherein
said first power source is a positive power source, and said second power source is a negative power source.

3. The self-emissive display device of an active matrix type according to claim 1, wherein
said selection signal has a first potential of a predetermined polarity when selected, and a second potential of a polarity opposite to that of said first potential when unselected.

4. The self-emissive display device of an active matrix type according to claim 1, wherein
said selection signal has a first potential of a predetermined polarity when selected, and, when unselected, a second potential of a polarity opposite to that of said first potential to turn off said selection driving circuit, said second potential being larger than the absolute value of a minimum required luminance voltage of said data signal or the absolute value of a maximum required luminance voltage thereof.

5. The self-emissive display device of an active matrix type according to claim 1, wherein
said emissive element is an organic electroluminescence element.

6. A display device of an active matrix type, wherein
each of a plurality of pixels is provided with a selection transistor, an element driving transistor, and an emissive element,
said emissive element emits light in response to a current supplied to said emissive element through said element driving transistor in accordance with a data signal supplied to said element driving transistor through said selection transistor when said selection transistor is turned on in response to a selection signal supplied thereto, and
said element driving transistor and said emissive element are connected in series between a first power source for applying a voltage of a first polarity with respect to a reference voltage and a second power source for applying a voltage of a polarity opposite to said first polarity.

7. The self-emissive display device of an active matrix type according to claim 6, wherein
said first power source is a positive power source, and said second power source is a negative power source.

8. The self-emissive display device of an active matrix type according to claim 6, wherein
said selection signal has a first potential of a predetermined polarity when selected, and a second potential of a polarity opposite to that of said first potential when unselected.

9. The self-emissive display device of an active matrix type according to claim 6, wherein said selection signal has a first potential of a predetermined polarity when selected, and, when unselected, a second potential of a polarity opposite to that of said first potential to turn off said selection transistor, said second potential being larger than the absolute value of a minimum required luminance voltage of said data signal or the absolute value of a maximum required luminance voltage thereof.

10. The self-emissive display device of an active matrix type according to claim 6, wherein said emissive element is an organic electroluminescence element.

11. A self-emissive display device of an active matrix type, comprising:

a plurality of selection lines extending in a row direction and sequentially receiving a selection signal;

a plurality of data lines extending in a column direction and receiving a data signal in accordance with displayed content; and a selection transistor, an element driving transistor, and an emissive element, provided in a vicinity of each intersection between said selection line and said data line, wherein said selection transistor has a gate connected to a corresponding one of said plurality of selection lines, said element driving transistor has a gate connected to a corresponding one of said plurality of data lines through said selection transistor, said emissive element has an anode connected to said element driving transistor for receiving a current from a first power source through said element driving transistor, and said emissive element has a cathode connected to a second power source for shifting a data voltage.

12. The self-emissive display device of an active matrix type according to claim 11, wherein said first power source is a positive power source, and said second power source is a negative power source.

13. The self-emissive display device of an active matrix type according to claim 11, wherein said selection signal has a first potential of a predetermined polarity when selected, and a second potential of a polarity opposite to that of said first potential when unselected.

14. The self-emissive display device of an active matrix type according to claim 11, wherein said selection signal has a first potential of a predetermined polarity when selected, and, when unselected, a second potential of a polarity opposite to that of said first potential to turn off said selection transistor, said second potential being larger than the absolute value of a minimum required luminance voltage of said data signal or the absolute value of a maximum required luminance voltage thereof.

15. The self-emissive display device of an active matrix type according to claim 11, wherein said emissive element is an organic electroluminescence element.

* * * * *

UNITED STATES PATENT AND TRADEMARK OFFICE
CERTIFICATE OF CORRECTION

PATENT NO. : 6,509,692 B2
DATED : January 21, 2003
INVENTOR(S) : Naoaki Komiya

It is certified that error appears in the above-identified patent and that said Letters Patent is hereby corrected as shown below:

<u>Title page,</u>
Item [56], References Cited, FOREIGN PATENT DOCUMENTS, delete "EP 0 917 172" and insert therefor -- EP 0 917 127 --.
Item [57], ABSTRACT,
Line 2, delete "(4)";
Line 2, after "line" delete "(1)";
Line 3, after "line" delete "(2)";
Line 3, after "TFT" delete "(6)";
Line 4, after "TFT" delete "(4)";
Line 5, after "TFT" delete "(6)";
Line 6, after "element" delete "(7)".

<u>Column 1,</u>
Line 21, after "attracting" delete "attentions" and insert therefor -- attention --.

<u>Column 4,</u>
Lines 35, 54, 57 and 61, after "to" delete "other" and insert therefor -- another --.

<u>Column 5,</u>
Line 4, after "to" delete "other" and insert therefor -- another --.

Signed and Sealed this

Twenty-ninth Day of July, 2003

JAMES E. ROGAN
*Director of the United States Patent and Trademark Office*